United States Patent [19]

Iwasawa et al.

[11] Patent Number: 5,093,223

[45] Date of Patent: Mar. 3, 1992

[54] METHOD OF FORMING A CURED COATING FILM

[75] Inventors: Naozumi Iwasawa, Hiratsuka; Osamu Isozaki, Yokohama, both of Japan

[73] Assignee: Kansai Paint Company, Limited, Amagasaki, Japan

[21] Appl. No.: 278,505

[22] Filed: Dec. 1, 1988

[30] Foreign Application Priority Data

Dec. 8, 1987 [JP] Japan .................. 62-311651
Jun. 13, 1988 [JP] Japan .................. 63-144985

[51] Int. Cl.$^5$ ............... G03C 5/00; G03C 1/725; G03F 7/025; C08G 59/18
[52] U.S. Cl. ........................ 430/280; 430/330; 522/904; 522/90; 522/103
[58] Field of Search ............. 430/280, 330; 522/904

[56] References Cited

U.S. PATENT DOCUMENTS

| | | | |
|---|---|---|---|
| 4,074,008 | 2/1978 | Green | 522/904 |
| 4,186,069 | 1/1980 | Muzyczko et al. | 522/904 |
| 4,338,232 | 7/1982 | Harris et al. | 522/904 |
| 4,565,771 | 1/1986 | Lynch et al. | 430/280 |
| 4,693,961 | 9/1987 | Bauer | 430/330 |
| 4,786,579 | 11/1988 | Tazawa et al. | 430/280 |

Primary Examiner—Marion E. McCamish
Assistant Examiner—Susan Berman
Attorney, Agent, or Firm—Armstrong, Nikaido, Marmelstein, Kubovcik & Murray

[57] ABSTRACT

The invention provides a method of forming a cured coating film which comprises exposing a coating composition consisting of, or containing as a main component, a resin containing polymerizable unsaturated group and aprotic onium-containing group of the formula

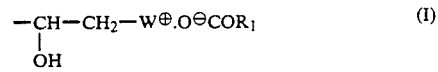

wherein $R_1$ means a hydrogen atom or a hydrocarbon group of 1 to 8 carbon atoms which may optionally be substituted by a hydroxyl, alkoxy or ester group or a halogen atom;

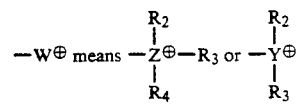

where Z means a nitrogen atom or phosphorus atom and Y means a sulfur atom; $R_2$, $R_3$ and $R_4$ are the same or different and respectively mean an organic group of 1 to 14 carbon atoms, provided that $R_2$ and $R_3$, or $R_2$, $R_3$ and $R_4$ may jointly form a heterocyclic group taken together with the adjacent nitrogen, phosphorus or sulfur atom, to actinic radiation or electron beams to thereby induce a crosslinking reaction and, then, subjecting the composition to heat treatment at a temperature not less than 80° C.

5 Claims, No Drawings

METHOD OF FORMING A CURED COATING FILM

The present invention relates to a method of forming a cured coating film.

When a resin composition containing polymerizable unsaturated groups is to be rendered water-soluble or water-dispersible, it has been common practice to introduce carboxyl or amino groups into the resin and neutralized them into salts. However, polar groups such as carboxyl and amino remain to be free in the film after curing of the resin composition to thereby detract from the water resistance, chemical resistance (resistance to alkali and acid) and other performance characteristics of the cured film.

On the other hand, in the soldering of electric or electronic parts to the printed circuit board, for instance, a solder resist is applied for avoiding deposition of the solder on areas other than the required area and also for protecting the printed circuit on the substrate. In many instances, a solder resist is applied by printing the board with a resist composition by the silk screen method or the like in conformity with a necessary pattern and, then, causing the composition to cure thermally or under actinic radiation such as ultraviolet light. However, with a trend toward increasing density of printed circuitry, a liquid phototype composition featuring a high patterning accuracy has been proposed. Thus, a liquid photopolymerizable solder resist composition is printed on a printed circuit board by silk screen printing or by means of a roll coater or the like and dried to the touch by heating or the like. Then, with a film having a necessary pattern drawn thereon being set in contact with the resulting resist layer, the assembly is irradiated with actinic radiation such as ultraviolet light to cure the exposed areas. Thereafter, the unexposed areas are dissolved out with a developer solution to form the necessary pattern and circuit-protective film.

However, the developer solution used for the conventional resist composition is generally an organic solvent which, however, presents risks of fire hazards, toxicity to man and other safety or sanitation problems. Resist compositions using a dilute aqueous alkali solution as the developer have also been developed but have the disadvantage that they are inferior in performance characteristics to compositions of the heat-curing type or organic solvent development type.

It is an object of the present invention to provide a method of forming a cured film having improved water and chemical resistances and other characteristics from a resin which can be dissolved or dispersed in water.

It is another object of this invention to provide a method of forming a cured resist film which can be developed with a nontoxic developer such as water or a dilute aqueous solution of acid and which has performance characteristics comparable to those obtainable with the conventional resist compositions of heat-curing type or organic solvent development type. Other objects and advantages of the present invention will become apparent as the following description proceeds.

The present invention provides a method of forming a cured coating film comprising exposing a coating composition consisting of, or containing as a main component, a resin containing polymerizable unsaturated group and aprotic onium-containing group of the formula

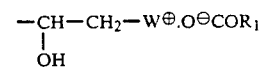

wherein $R_1$ means a hydrogen atom or a hydrocarbon group of 1 to 8 carbon atoms which may optionally be substituted by a hydroxyl, alkoxy or ester group or a halogen atom;

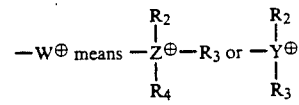

where Z means a nitrogen atom or phosphorus atom and Y means a sulfur atom; $R_2$, $R_3$ and $R_4$ are the same or different and respectively mean an organic group of 1 to 14 carbon atoms, provided that $R_2$ and $R_3$, or $R_2$, $R_3$ and $R_4$ may jointly form a heterocyclic group taken together with the adjacent nitrogen, phosphorus or sulfur atom, to actinic radiation or electron beams to thereby induce a crosslinking reaction and, then, subjecting the composition to heat treatment at a temperature not less than 80° C.

In accordance with the present invention, the specific aprotic onium moiety contained in the resin produce the following beneficial effects: (1) it makes the resin water-soluble or water-dispersible; (2) it catalyzes the crosslinking of the coating film in the step of curing; and (3) it is eliminated from the coating film as a result of Hofmann degradation which occurs readily upon heating after the crosslinking curing of the coating film, whereby various performance characteristics, such as water resistance and chemical resistance, of the cured coating film can be prevented from decreasing. Therefore, the coating films can be cured rapidly and cured coating films having good performance characteristics, such as good water resistance and chemical resistance, can be obtained according to the method of the invention.

When the resin having polymerizable unsaturated group and aprotic onium-containing group is an aromatic epoxy resin derivative containing 0.3–10 moles, per kilogram of resin, of the polymerizable unsaturated group and 0.1–3 moles, per kilogram of resin, of the onium-containing group, curing of the resin, with a photopolymerization initiator added thereto, by crosslinking by means of actinic radiation can be followed by dissolution out of unexposed areas using water or an aqueous dilute acid solution as the developer. In this case, the coating film, when subjected to post-heating after the crosslinking curing under actinic radiation, acquires good solder plating resistance, heat resistance, chemical resistance and adhesion to substrate, among others, which render the film desirable particularly as a patterned resist film.

In accordance with the present invention, a resin is used which contains polymerizable unsaturated group and aprotic onium-containing group of the above formula (I) and is soluble or dispersible in water. Any resin containing polymerizable unsaturated group and onium-containing group of the above formula (I) may be used without any particular limitation and the resin may be any of known resins of the acrylic, polyester, urethane, polybutadiene, alkyd, epoxy or phenolic type, for instance. Among these resins, resins of the acrylic, polyester and epoxy types are preferred. In the practice of the invention, resins containing hydroxyl group attached to primary carbon atom are particularly preferred from the curability viewpoint. The molecular weight of the resin is not critical. Generally, however, the molecular weight of the resin as determined by gel permeation chromatography (GPC) should preferably be about 250–100,000, more preferably about 400–50,000, most preferably about 500–20,000. A molecular weight exceeding the above range is not preferable since it tends to make the coating compositions containing it inferior in coating workability.

Suitable as the above-mentioned polymerizable unsaturated group are acryloyl, methacryloyl, itaconoyl, maleoyl, fumaroyl, crotonoyl, acrylamido, methacrylamido, cinnamoyl, vinyl, allyl and the like groups. Among them, acryloyl and acrylamido groups are preferred.

The polymerizable unsaturated group may be introduced either into the resin portion which serves as the cation of the onium salt or into the anion of the onium salt. In the latter case, an organic carboxylic acid having a polymerizable unsaturated group is used, for instance acrylic acid, methacrylic acid, crotonic acid, maleic acid monoalkyl ($C_{1-6}$) ester, fumaric acid monoalkyl ($C_{1-6}$) ester, itaconic acid monoalkyl ($C_{1-6}$) ester.

The aprotic onium-containing group, which has the above formula (I), is required to be such that the carbon atom beta ($\beta$) to the onium salt-forming nitrogen, phosphorus or sulfur atom is a secondary carbon atom having a hydroxyl group. Such aprotic onium salt is a quaternary ammonium salt, a quaternary phosphonium salt or a tertiary sulfonium salt. Specific examples of the cation in the aprotic onium-containing group are as follows:

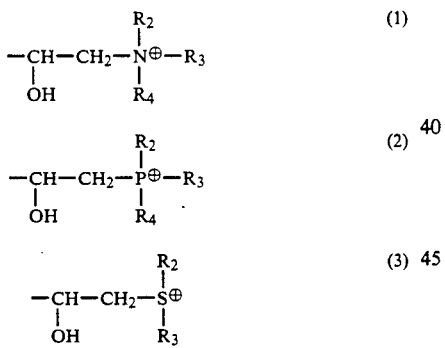

In the above formulas, $R_2$, $R_3$ and $R_4$ are the same or different and each is an organic group of 1 to 14 carbon atoms. The organic groups $R_2$ and $R_3$, or $R_2$, $R_3$ and $R_4$ may combinedly form, together with the adjacent nitrogen, phosphorus or sulfur atom, a heterocylic group.

The organic groups of 1 to 14 carbon atoms which are represented by $R_2$, $R_3$ and $R_4$ are not limited to any particular species provided that they will not interfere with the ionization of the ammonium, phosphonium or sulfonium group to any substantial extent. Thus, for instance, hydrocarbon groups of 1–14 carbon atoms which may optionally contain one or more hetero atoms, for example an oxygen, sulfur and/or nitrogen atom or atoms in the form of a hydroxyl, alkoxy, sulfonyloxy or amino group, among others, are generally used.

As such hydrocarbon groups, there may be mentioned, for example, aliphatic, alicyclic or aromatic hydrocarbon groups, such as alkyl, cycloalkyl, cycloalkylalkyl, aryl and aralkyl groups. The alkyl group may be straight or branched and desirably contains not more than 14 carbon atoms, in particular not more than 8 carbon atoms and includes, among others, methyl, ethyl, n- or iso-propyl, n-, iso-, sec- or tert-butyl, pentyl, heptyl and octyl. The cycloalkyl group preferably contains not more than 14 carbon atoms, in particular 5–8 carbon atoms, and includes, among others, cyclopentyl, cyclohexyl, cyclohexylmethyl and cyclohexylethyl. The aryl includes, among others, phenyl, tolyl and xylyl. A suitable example of the aralkyl is benzyl.

As preferred examples of the oxygen-containing hydrocarbon group, there may be mentioned a hydroxyalkyl group (in particular a hydroxyl-lower-alkyl group), such as hydroxymethyl, hydroxyethyl, hydroxybutyl, hydroxypentyl, hydroxyheptyl or hydroxyoctyl, and an alkoxyalkyl group (in particular a lower alkoxy-lower alkyl group), such as methoxymethyl, methoxybutyl, ethoxymethyl, ethoxyethyl, n-propoxyethyl, isopropoxymethyl, n-butoxymethyl, iso-butoxyethyl or tert-butoxyethyl. As a preferred example of the sulfur-containing hydrocarbon group, there may be mentioned 2-benzene-sulfonyloxyethyl, among others. A preferred example of the nitrogen-containing hydrocarbon group is 2-(N-acetylamino)ethyl.

The heterocyclic group $-W^\oplus$ formed combinedly by $R_2$ and $R_3$, or $R_2$, $R_3$ and $R_4$, together with the adjacent nitrogen, phosphorus or sulfur atom is, for example, as follows:

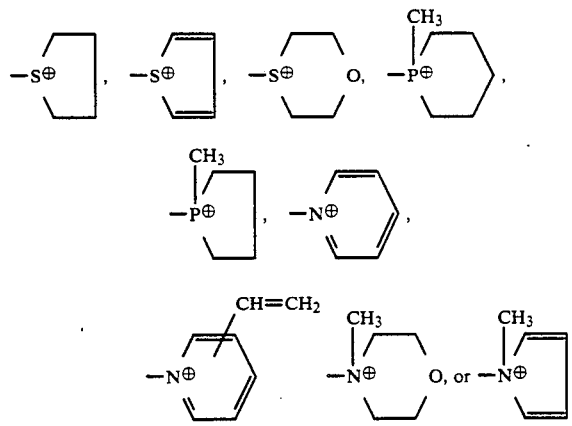

Pyridyl is preferred among others.

The hydrocarbon group of 1 to 8 carbon atoms as represented by $R_1$ in the above formula (I), which may optionally be substituted by a hydroxyl, alkoxy or ester group or a halogen atom, there may be mentioned, for example, aliphatic, alicyclic or aromatic hydrocarbon groups, such as alkyl, alkenyl, cycloalkyl, cycloalkylalkyl, aryl and aralkyl groups. Among these, alkyl and alkenyl groups are preferred. The alkyl and alkenyl groups may be straight or branched and, in particular, lower ones are desirable, such as methyl, ethyl, n- or iso-propyl, n-, iso-, sec- or tert-butyl, pentyl, heptyl, octyl, vinyl and 2-methylvinyl. A typical example of the cycloalkyl is cyclohexyl. The cycloalkylalkyl group is, for example, cyclohexylmethyl or cyclohexylethyl. The aryl group includes phenyl, tolyl and xylyl, among others. A typical example of the aralkyl group is benzyl. As preferred examples of the hydroxyl-substituted hydrocarbon group, there may be mentioned hydroxyalkyl groups (in particular hydroxy-lower alkyl groups), such as hydroxymethyl, hydroxyethyl, hydroxybutyl, hydroxypentyl, hydroxyheptyl and hydroxyoctyl. Preferred examples of the alkoxy-substituted hydrocarbon group are alkoxyalkyl groups (in particular lower alkoxy-lower alkyl groups), such as methoxymethyl, ethoxymethyl, ethoxyethyl, n-propoxymethyl, iso-propoxymethyl, n-butoxymethyl, iso-butoxyethyl and tert-butoxyethyl. As preferred examples of the ester group-substituted hydrocarbon group, there may be mentioned lower alkoxycarbonylalkyl, lower alkoxycarbonylalkenyl and acyloxyalkyl groups, such as methoxycarbonylmethyl, propoxycarbonylethyl, ethoxycarbonylpropyl, methoxycarbonylbutyl, methoxycarbonylethylenyl, ethoxycarbonylethylenyl, acetoxymethyl, acetoxyethyl, propionyloxymethyl and propionyloxyethyl. Preferred examples of the halogen-substituted hydrocarbon group are chloromethyl, bromomethyl, iodomethyl, dichloromethyl, trichloromethyl, chloroethyl and chlorobutyl, among others.

Each resin molecule should have at least one polymerizable unsaturated group of the kind mentioned above. From the curability viewpoint, the polymerizable unsaturated group content should preferably be within the range of 0.1 to 10 moles, more preferably within the range of 0.2 to 5 moles, most preferably within the range of 1 to 4 moles, per kilogram of the resin (as solids). When said content is lower than 0.1 mole, the resin cannot be cured to a satisfactory extent whereas when said content exceeds 10 moles, mechanical properties of the cured resin tend to decrease unfavorably.

The content of the above-mentioned aprotic onium-containing group should preferably be within the range of 0.1 to 5 moles, more preferably within the range of 0.1 to 2 moles, most preferably within the range of 0.2 to 1 mole, per kilogram of the resin (as solids). If said content is lower than 0.1 mole, the catalytic effect will be insufficient, the curability will be low and, when the resin is used in aqueous systems, it will be difficult to dissolve or disperse the resin in water. Conversely, when said content exceeds 5 moles, the water resistance, chemical resistance and other performance characteristics of the cured product tend to become decreased unfavorably.

The polymerizable unsaturated group introduction into resin can be performed by using known techniques. Thus, for instance, (i) the addition reaction between carboxyl group and epoxy group, (ii) the addition reaction between hydroxyl group and epoxy group, (iii) the esterification reaction between hydroxyl group and carboxyl group, (iv) the addition reaction between isocyanate group and hydroxyl group, (v) the half esterification reaction between hydroxyl group and acid anhydride, or (vi) the ester exchange reaction between hydroxyl group and ester group can be utilized. The polymerizable unsaturated group may be contained either in a compound having such functional group as mentioned above or in the resin or in both of them.

The reactions (i), (ii) and (iv), which are typical of the above-mentioned reactions, are described below in further detail.

Usable as the polymerizable unsaturated group- and carboxyl group-containing compound in the above reaction (i) are, for example, (meth)acrylic acid, crotonic acid, itaconic acid monoalkyl esters, maleic acid monoalkyl esters and fumaric acid monoalkyl esters. Usable as the polymerizable unsaturated group- and hydroxyl group-containing compound in the above reaction (ii) are, for instance, 2-hydroxyethyl (meth)acrylate, 2-hydroxypropyl (meth)acrylate, allyl alcohol, N-methylol(meth)acrylamide and the like monohydric alcohols having a polymerizable unsaturated group. Usable as the polymerizable unsaturated group- and isocyanate group-containing compound in the above reaction (iv) are equimolar adducts between the polymerizable unsaturated group-containing monohydric alcohols mentioned above and a diisocyanate compound such as tolylene diisocyanate or isophorone diisocyanate, and α, α-dimethyl-m-isopropenylbenzyl isocyanate.

The onium-containing group introduction into resin can be carried out, for example by the method (a) or (b) mentioned below.

(a) The method comprising reacting a 2-halogeno-1-hydroxyethyl group-containing resin with a tertiary amine, a phosphine or a thioether in the absence or presence of an inert organic solvent, then converting the halogen atom to a hydroxyl group by anion exchange and reacting the resulting resin with an organic acid.

When the compound to be reacted with the resin is a tertiary amine, the above reaction may be illustrated by the following reaction equation:

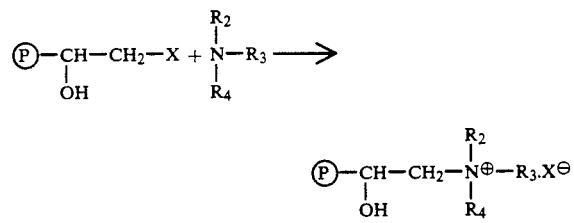

In the above equation, ⓟ is the basic portion of the resin, X is a halogen atom, and $R_2$, $R_3$ and $R_4$ are as defined above.

The reaction equation for the case in which a phosphine is used in lieu of the tertiary amine will be obtained by substituting P for the N in the above equation, and that for the case in which a thioether is used in lieu of the tertiary amine will be obtained by substituting S for the N in the above equation and deleting the $-R_4$ moiety from said equation.

The above-mentioned reaction between resin and tertiary amine, phosphine or thioether is carried out under heating at about 100°–150° C. Said reaction will be complete in about 1 to 20 hours.

The substitution of a hydroxyl group for the halogen atom can be effected, for example by passing the resin to be treated through a layer of an ordinary anion exchange resin which occurs, for example, in the form of beads.

The reaction between the thus-obtained, hydroxyl-substituted resin and an organic acid can proceed readily when both the reactants are brought into contact with each other at room temperature.

(b) The method comprising reacting a 1,2-epoxy group-containing resin simultaneously with a tertiary amine, phosphine or thioether and an organic acid in the absence or presence of an inert organic solvent.

When the compound to be reacted with the resin is a tertiary amine, the above reaction may be represented by the following reaction equation:

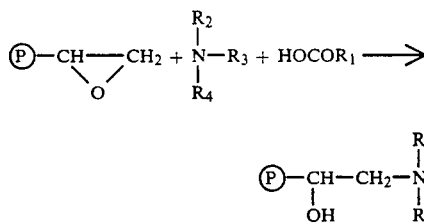

In the above equation, $R_1$, $R_2$, $R_3$, $R_4$ and $\textcircled{P}$ are as defined above.

The reaction equations for the cases where a phosphine and a thioether are respectively used in lieu of the tertiary amine will be obtained, in the same manner as mentioned above for the method (a), by substituting P for the N in the above equation or substituting S for the N and deleting the moiety $-R_4$, respectively.

The above reaction among resin, tertiary amine and organic acid is carried out under heating at about 40°-80° C. and will be complete in about 1 to 20 hours.

As the inert organic solvent for use in the above methods (a) and (b), there may be mentioned, for example, ether alcohol solvents, such as ethylene glycol monobutyl ether, ethylene glycol monoethyl ether, ethylene glycol monomethyl ether, diethylene glycol monobutyl ether, diethylene glycol monoethyl ether and diethylene glycol monomethyl ether, ether ester solvents, such as ethylene glycol monomethyl ether acetate, ether solvents, such as dioxane, ethylene glycol diethyl ether, tetrahydrofuran, diglyme and glyme, alcohol solvents, such as ethanol, propanol and butanol, and ketone solvents, such as methyl ethyl ketone and methyl isobutyl ketone.

Preferred among these solvents are ethylene glycol monobutyl ether, ethylene glycol monoethyl ether, ethylene glycol monomethyl ether, diethylene glycol monobutyl ether, diethylene glycol monoethyl ether, diethylene glycol monomethyl ether, dioxane, tetrahydrofuran, diglyme and glyme.

A wide variety of known organic carboxylic acids capable of forming an anion ($^-OCOR_1$) can be used as the organic acid ($HOCOR_1$), where $R_1$ is a hydrogen atom or a hydrocarbon group of 1 to 8 carbon atoms which may optionally be substituted by a hydroxyl, alkoxy or ester group or a halogen atom. Specific examples are acetic acid, formic acid, trimethylacetic acid, acrylic acid, methacrylic acid, lactic acid, hydroxyacetic acid, crotonic acid, chloroacetic acid, maleic acid monoalkyl ($C_{1-6}$) ester, fumaric acid monoalkyl ($C_{1-6}$) ester and itaconic acid monoalkyl ($C_{1-6}$) ester. Among these, those having a dissociation constant (pKa) of at least $1 \times 10^{-5}$, in particular acetic acid, formic acid, acrylic acid and lactic acid, are particularly preferred.

When the above-mentioned resin is an acrylic resin, the onium-containing group introduction into said resin can be carried out either by the above-mentioned method (a) or (b) or by polymerizing, in the conventional manner, a (meth)acrylic ester monomer of the general formula

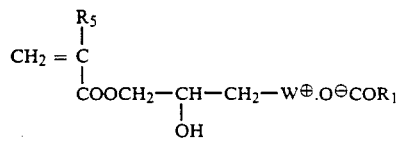

wherein $R_5$ is a hydrogen atom or a methyl group and $R_1$ and W are as defined above, either alone or with at least one comonomer copolymerizable therewith.

Among the above obtained resins containing the polymerizable unsaturated group and onium-containing group, those obtained using a water-miscible solvent or without using any solvent in the step of resin production can be made up into aqueous solutions or aqueous dispersions by adding water to them or adding them to water. The water-soluble or water-dispersible resins according to the invention may also be diluted with an appropriate organic solvent as needed for the intended purpose.

The solvent to be used in diluting the above-mentioned resins in the practice of the invention is not limited any particular species provided that it can dissolve or disperse said resins therein. Thus, for example, acetic esters such as ethyl acetate and butyl acetate; glycol ethers such as ethylene glycol, diethylene glycol and propylene glycol ethers; aromatic hydrocarbons such as toluene and xylene; alcohols such as methanol, ethanol and butanol; and ketones such as methyl ethyl ketone and methyl isobutyl ketone may be used either alone or in the form of a mixture of two or more of these. The amount of the solvent should be adjusted suitably depending on the method of application of the coating composition and other factors.

In the practice of the invention, the thus-obtained resin composition can be applied to surfaces to be coated by spray coating, brush coating, roller coating, immersion coating or the like ordinary method of coating. After application of the composition to said surfaces, water or the organic solvent is evaporated by allowing to stand, heating, air blowing or some other appropriate means to give coating films. The films can be crosslinked and cured by irradiation with electron beams. If a photopolymerization initiator is incorporated into the resin composition in advance, the coating films can also be cured by irradiation with actinic radiation such as ultraviolet light.

A wide variety of known photopolymerization initiators can be used for the above purpose. Mention may be made, for instance, benzoin, benzoin methyl ether, benzoin ethyl ether, benzyl, diphenyl disulfide, tetramethylthiuram monosulfide, eosine, thionine, diacetyl, Michler's ketone, anthraquinone, chloroanthraquinone, methylanthraquinone, α-hydroxyisobutyrophenone, p-isopropyl-α-hydroxyisobutyrophenone, α, α'-dichloro-4-phenoxyacetophenone, 1-hydroxy-1-cyclohexylacetophenone, 2,2-dimethoxy-2-phenylacetophenone, methylbenzoyl formate, thioxanthone and benzophenone. These are preferably used in an amount of 0.1 to 10 parts by weight per 100 parts by weight of the resin component (solids). In amounts smaller than 0.1 part by weight, the curability tends to decrease, while, in amounts greater than 10 parts by weight, the mechanical strength of the cured films tends to decrease.

The coating composition according to the invention may contain, as necessary, a curing catalyst for heat curing, for example an alkali metal hydroxide such as sodium hydroxide or lithium hydroxide; an alkaline earth metal hydroxide such as calcium hydroxide or magnesium hydroxide; or a hydroxide, organic acid salt or alkoxide of a metal selected from among nickel, copper, molybdenum, lead, iron, chromium, manganese, tin and cobalt. Such curing catalyst is preferably used in an amount of 10 parts by weight or less, more preferably within the range of 0.1 to 5 parts by weight, per 100 parts by weight of the resin component.

The composition according to the invention may further contain various additives, for example one or more additives selected from among colored pigments, fillers, rust preventive pigments, dyes, thermoplastic polymers, polyfunctional vinyl monomers or oligomers, leveling agents, antifoaming agents and antisag agents. As the colored pigments, fillers, rust preventive pigments and dyes, those in ordinary use in the field of paints and ink can be used, preferably in a total amount of not more than 50% by weight, more preferably not more than 30% by weight, based on the solid content of the composition according to the invention. The polyfunctional vinyl monomers or oligomers help to improve the physical properties of the coating films and include, among others, trimethylolpropane tri(meth)acrylate, dipentaerythritol (meth)acrylate, norbornene di(meth)acrylate and tricyclodecanedimethanol di(meth)acrylate. These polyfunctional vinyl monomers or oligomers and/or the thermoplastic polymers are preferably used in an amount of not more than 30% by weight based on the solid content of the coating composition.

In accordance with the invention, the coating films made of the above-mentioned resin or containing said resin as the main component are cured by exposing them to actinic radiation such as ultraviolet light or to electron beams to thereby cause crosslinking and then heating them at a temperature not lower than 80° C. In this way, the onium moieties which remain in the cured coating films and are poor in effects to make the films resistant to water and chemicals and other effects are thermally decomposed and, as a result, the cured coating films acquire good water resistance, chemical resistance and other performance characteristics.

The source of actinic radiation may be any one known so far as the source of actinic radiation such as ultraviolet light. A 1 to 10 kW (ultra)high pressure mercury lamp is most desirable. A mercury lamp, a chemical lamp, sunlight, an arc lamp, a xenon lamp or the like is also usable. The coating films are exposed to actinic radiation in a dose required for them to be cured, generally about 10 to 2,000 mJ/cm$^2$. In cases where the coating composition does not contain any pigment, the dose should preferably be about 50 to 200 mJ/cm$^2$ and, in cases where the composition contains one or more pigments, the dose should preferably be about 100 to 800 mJ/cm$^2$.

As the electron beam accelerator for use in irradiating the coating films with electron beams, there may be mentioned, for example, the following: Cockcroft accelerator, Cockcroft-Walton accelerator, resonance transformer type, transformer type, insulated core transformer type, dynamitron type, linear filament type, broad beam type, area beam type, cathode type and high frequency type. The dose of electron beams is not critical provided that it is sufficient to cure the coating films. Generally, however, it is advisable to irradiate the coating films with about 0.5 to 20 megarads (Mrad) of electron beams at about 100 to 2,000 keV. Electron beam irradiation should preferably be conducted in an inert gas atmosphere.

The above-mentioned irradiation with actinic radiation or electron beams induces the radical polymerization among the polymerizable unsaturated groups in the resin, whereby the coating films are crosslinked and cured.

The crosslinked and cured coating films obtained in the above manner are then subjected to heat treatment at a temperature not lower than 80° C., preferably a temperature of about 120° to 200° C., preferably for a period not shorter than 5 minutes, more preferably about 10 to 60 minutes.

In accordance with the invention, the coating films can be crosslinked and cured rapidly and the resulting crosslinked, cured coating films can have good performance characteristics, for example good water resistance and chemical resistance.

The method of the present invention can be applied to curing of water-base ultraviolet-curable ink, water-base low-temperature-curing paints and the like.

In forming resist films by the method of the invention, it is preferable to use, as the polymerizable unsaturated group- and onium [formula (1)] group-containing resin mentioned above, an aromatic epoxy resin derivative prepared by polymerizable unsaturated group and onium-containing group introduction into an aromatic epoxy resin. Typical examples of such aromatic epoxy resin are diglycidyl ethers derived from aromatic bisphenols such as bisphenol A, bisphenol F and bisphenol S, polymers of such diglycidyl ethers and the above-mentioned bisphenols, phenol novolak type epoxy resins, cresol novolak type epoxy resins, triglycidyl isocyanurate, and nuclearly halogenated derivatives of these. Partial modifications of these epoxy resins, such as partial benzoic acid modifications, may also be used. From the reactivity viewpoint, the aromatic epoxy resin should preferably have an epoxy group content of not less than 0.1 mole per kilogram of resin. The molecular weight of said resin is not critical. From the viewpoint of drying to the touch of the coating films, such as resist films, however, said resin should preferably have a peak molecular weight of about 500 or more as determined by GPC while, from the coating behavior viewpoint, the peak molecular weight should preferably be not more than 5,000.

For the formation of resist films, it is preferable that the polymerizable unsaturated group content is within the range of 0.3 to 10 moles, more preferably within the range of 0.5 to 5 moles, per kilogram of the resin solids of said aromatic epoxy resin derivative. The onium-containing group [formula (I)] content should preferably be within the range of 0.1 to 3 moles, more preferably within the range of 0.3 to 2 moles, per kilogram of the resin solids.

For forming resist films, the composition comprising the above-mentioned aromatic epoxy resin derivative, if necessary supplemented with a photopolymerization initiator is first applied to substrates by spray coating, brush coating, roller coating, immersion coating, silk screen printing or the like conventional method, generally to a dry film thickness of 10 to 100 μm. Then, the uncured coating films are irradiated with actinic radiation, such as ultraviolet light, or electron beams for curing them by crosslinking. The subsequent heating at a temperature not lower than 80° C. in the above-mentioned manner causes the addition reaction between unsaturated groups and hydroxyl groups remaining in the resin to proceed, whereby coating films having higher crosslinking density are formed and at the same time the heat resistance and chemical resistance are improved as a result of thermal decomposition of the hydrophilic onium-containing groups in the coating films to render the films hydrophobic.

A patterned protective coating film, for example a patterned resist film, can be formed on a substrate, for example a circuit board, by forming a coating film on the substrate using the coating composition with a photopolymerization initiator added thereto, drying the uncured film until it has dried to the touch at a temperature not higher than 100° C., for instance, then irradiating the film with actinic radiation through a patterned film (photomask), and developing the coating film with water or a dilute inorganic or organic acid solution in water having a concentration of not higher than 3% by weight for dissolution and removal of the unexposed areas. The subsequent thermal curing gives a patterned resist film. The heat treatment should preferably be carried out at about 120° to 180° C. for about 10 to 60 minutes.

The above-mentioned process makes it possible to form coating films with good adhesion to substrates and good heat resistance and chemical resistance and, in forming patterned resist films, can dissolve the safety and health problems since the uncured films can be developed with water or a dilute aqueous acid solution which is harmless. The resist films obtained by the method of the invention can serve as solder resists and show good solder plating resistance.

The following examples are further illustrative of the present invention. "Part(s)" and "%" are "part(s) by weight" and "% by weight", respectively.

EXAMPLE 1

A four-necked flask was charged with 463.3 parts of a mixture composed of 209 parts of Epikote No. 154 (Shell Chemical), 139 parts of ethylene glycol monobutyl ether, 84 parts of acrylic acid, 31 parts of thiodiglycol and 0.3 part of hydroquinone, and the mixture was heated at 80° C. for 3 hours. The resin solution obtained had a nonvolatile matter content of 70%. This was diluted to a nonvolatile matter content of 50% by adding deionized water thereto. The resultant dilution occurred as an emulsion and had a Gardner viscosity (25° C.) of P-Q. The resin obtained had a peak molecular weight of about 650 as measured by GPC, a polymerizable unsaturated group content of 1.2 moles/kg and a tertiary sulfonium-containing group content of 1.2 moles/kg.

This emulsion was applied to a polished mild steel plate to a wet film thickness of 100 μm. After solvent evaporation by heating at 60° C. for an hour, the film was cured by electron beam irradiation (5 Mrad). The subsequent 30 minutes of heating at 100° C. gave a final coating film.

EXAMPLE 2

A mixture of 284 parts of glycidyl methacrylate, 716 parts of n-butyl methacrylate and 30 parts of azobisisobutyronitrile was added to a four-necked flask containing 667 parts of n-butyl alcohol at 130° C. over 3 hours to thereby effect the polymerization reaction. The flask contents were then cooled to 110° C., 72 parts of acrylic acid, 0.5 part of hydroquinone and 1 part of tetraethylammonium bromide were further added, and the reaction was allowed to proceed until the acid value became 0 (zero). The reaction mixture was cooled to 70° C., then 60 parts of acetic acid and 89 parts of dimethylaminoethanol were further added, and the reaction was allowed to proceed for 5 hours. The thus-obtained resin solution had a nonvolatile matter content of about 64% and a peak molecular weight of about 12,000 as measured by GPC. Dilution of this solution with deionized water to a nonvolatile matter content of 50% gave an aqueous solution which had a Gardner viscosity (25° C.) of S. The resin obtained had a peak molecular weight of about 7,500 as measured by GPC, a polymerizable unsaturated group content of 0.82 mole/kg and a quaternary ammonium-containing group content of 0.82 mole/kg.

The resin solution was supplemented with 50 parts of benzoin ethyl ether and applied to a polished mild steel plate to a wet film thickness of 100 μm. After solvent evaporation by heating at 60° C. for an hour, the film was irradiated with a high-pressure mercury lamp to a light quantity of 100 mJ/cm$^2$ and then heated at 160° C. for 10 minutes to give a final coating film.

EXAMPLE 3

A carboxyl-terminated polyester having a peak molecular weight of about 2,000 as measured by GPC was synthesized by dehydration condensation at 220° C. of 650 parts of itaconic acid and 248 parts of ethylene glycol. To this polyester were added 93 parts of epichlorohydrin and 727 parts of isobutanol, and the mixture was heated at 110° C. until the acid value became 0. To the reaction mixture was further added 90 parts of pyridine, and the resultant mixture was heated at 110° C. for 15 hours. To the thus-obtained resin solution was added 1,000 parts of water. The chloride ion was eliminated from the resultant mixture by treatment on an anion exchange resin. The so-treated solution was supplemented with 50 parts of 88% formic acid. The aqueous resin emulsion thus obtained had a nonvolatile matter content of 35% and a Gardner viscosity (25° C.) of B. The resin obtained had a peak molecular weight of about 2,200 as measured by GPC, a polymerizable unsaturated group content of 5.6 moles/kg and a quaternary ammonium-containing group content of 1.3 moles/kg.

The above emulsion was supplemented with 50 parts of Michler's ketone and 2 parts of cobalt octanoate and applied to a polished mild steel plate to a wet film thickness of 100 μm. After solvent evaporation by heating at 60° C. for 30 minutes, the film was cured by irradiating it with a high-pressure mercury lamp to a light quantity of 200 mJ/cm$^2$ and then heated at 130° C. for 10 minutes to give a final coating film.

COMPARATIVE EXAMPLES 1–3

In Comparative Examples 1–3, the final heating that was performed in Examples 1–3 was omitted. Comparative Example 1 is a counterpart to Example 1, Comparative Example 2 to Example 2, and Comparative Example 3 to Example 3.

COMPARATIVE EXAMPLE 4

The procedure of Example 2 was followed except that 62 parts of monoethanolamine was used in lieu of 60 parts of acetic acid and 89 parts of dimethylaminoethanol and that 60 parts of acetic acid was added, together with the deionized water, to the resin solution to give an aqueous solution having a nonvolatile matter content of 10%.

The coated plates obtained above in the above-mentioned Examples 1-3 and Comparative Examples 1-4 were tested for water resistance and chemical resistance (alkali resistance and acid resistance). The results obtained are shown below in Table 1.

[Test methods]

Water resistance: Immersion in deionized water (40° C., 7 days)

Alkali resistance: Immersion in 5% aqueous caustic soda (30° C., 8 hours)

Acid resistance: Immersion in 5% aqueous sulfuric acid (30° C., 8 hours)

TABLE 1

|  | Water resistance | Alkali resistance | Acid resistance |
| --- | --- | --- | --- |
| Example 1 | No change | No change | No change |
| Example 2 | No change | No change | No change |
| Example 3 | No change | Slight discoloration | No change |
| Comparative Example 1 | Whitening | Discoloration | Whitening and blistering |
| Comparative Example 2 | Whitening and swelling | Discoloration and blistering | Whitening and blistering |
| Comparative Example 3 | Semi-dissolution | Dissolution | Dissolution |
| Comparative Example 4 | Blistering | Discoloration | Whitening and blistering |

EXAMPLES 4-8 AND COMPARATIVE EXAMPLES 5-8

Aromatic epoxy resin derivatives were produced by the methods described below in Preparation Examples 1-5 and Comparative Preparation Examples 1-4.

Preparation of aromatic epoxy resin derivatives

PREPARATION EXAMPLE 1

| Epikote 154 (*1) | 500 parts |
| --- | --- |
| Acrylic acid | 180 parts |
| Tetraethylammonium bromide | 1.0 part |
| Hydroquinone | 0.5 part |

(*1) Epikote 154 is a phenol novolak type epoxy resin manufactured by Yuka Shell Epoxy Co., Ltd.;

The above materials were dissolved in 250 parts of ethylene glycol monobutyl ether in a flask, and the solution was heated at 110° C. for 5 hours to give an epoxy ester solution with an acid value (of the resin) of 0.5. This solution was cooled to about 50° C. and, then, 36 parts of N,N-dimethylethanolamine and 24 parts of acetic acid were added, and the mixture was heated at 70° C. for 6 hours to give a resin solution having a solid content of 75% (resin solution A-1). The resin (as solids) had a polymerizable unsaturated group content of 3.4 moles/kg, a quaternary ammonium-containing group content of 0.55 mole/kg and a peak molecular weight of about 750 as measured by GPC. number average molecular weight about 500, epoxy equivalent about 174.

PREPARATION EXAMPLE 2

| Epikote 190S80 (*2) | 500 parts |
| --- | --- |
| Acrylic acid | 171 parts |
| Thiodiglycol | 122 parts |
| Methoxyhydroquinone | 0.5 part |

(*2) Epikote 190S80 is a cresol novolak type epoxy resin manufactured by Yuka Shell Epoxy Co., Ltd.; number average molecular weight about 1,100, epoxy equivalent about 210.

The above materials were dissolved in 350 parts of ethylene glycol monoethyl ether in a flask, and the solution was heated at 70° C. for 10 hours to give a resin solution (A-2) having a solid content of 69%. The resin (as solids) had a polymerizable unsaturated group content of 3.0 moles/kg, a tertiary sulfonium-containing group content of 1.26 moles/kg and a peak molecular weight of about 1,400 as measured by GPC.

PREPARATION EXAMPLE 3

| Epikote 1004 (*3) | 500 parts |
| --- | --- |
| Acrylic acid | 25 parts |
| Tetraethylammonium bromide | 1.0 part |
| Hydroquinone | 0.3 part |

(*3) Epikote 1004 is a bisphenol A type epoxy resin manufactured by Yuka Shell Epoxy Co., Ltd.; number average molecular weight about 2,000, epoxy equivalent about 960.

The above materials were dissolved in 200 parts of methyl isobutyl ketone, and the solution was heated at 100° C. for 8 hours to give an epoxy ester solution with an acid value (of the resin) of 0.3. This solution was cooled to about 30° C. and, then, 17.5 parts of triethylamine and 10 parts of acetic acid were added, and the resultant mixture was heated at 40° C. for 10 hours to give a resin solution (A-3) having a solid content of 73%. The resin (as solids) had a polymerizable unsaturated group content of 0.63 mole/kg, a quaternary ammonium-containing group content of 0.31 mole/kg and a peak molecular weight of about 1,200 as measured by GPC.

PREPARATION EXAMPLE 4

| Triglycidyl isocyanurate (epoxy equivalent 190) | 500 parts |
| --- | --- |
| Methacrylic acid | 86 parts |
| Hydroquinone | 0.5 part |
| Tetraethylammonium chloride | 1.0 part |

The above materials were dissolved in 250 parts of ethylene glycol monobutyl ether in a flask, and the solution was heated at 120° C. for 4 hours to give an epoxy ester solution having an acid value (of the resin) of 0.5. This solution was cooled to about 50° C. and, then, 227 parts of triphenylphosphine, 72 parts of N,N-dimethylethanolamine and 117 parts of acrylic acid were added, and the resultant mixture was heated at 70° C. for 10 hours to give a resin solution (A-4) having a solid content of 80%. The resin (as solids) had a polymerizable unsaturated group content of 2.5 moles/kg, a quaternary onium-containing group (phosphonium-containing group + ammonium-containing group) content of 1.55 moles/kg and a peak molecular weight of about 400 as measured by GPC.

PREPARATION EXAMPLE 5

To 174 parts of tolylene diisocyanate in a flask, there was added dropwise at about 20° C. over 2 hours 116 parts of 2-hydroxyethyl acrylate. Then, the mixture was maintained at 30° C. for 3 hours to give an adduct (B-1).

| | |
|---|---|
| Epikote 154 | 500 parts |
| Acrylic acid | 108 parts |
| Hydroquinone | 0.7 part |
| Tetraethylammonium bromide | 1.5 parts |

A mixture of the above four materials was dissolved in a mixture of 200 parts of diethylene glycol dimethyl ether and 200 parts of methyl amyl ketone in a flask, and the solution was heated at 110° C. for 4 hours to give an epoxy ester solution having an acid value (of the resin) of 0.8. This solution was cooled to about 50° C., 290 parts of the adduct B-1 obtained in the above manner was added, and the resultant mixture was heated at about 90° C. for 5 hours. Infrared spectrophotometric analysis of the reaction mixture obtained failed to detect the isocyanate group, indicating complete consumption of the isocyanate group. The thus-obtained reaction mixture was cooled to about 50° C., 172 parts of thiodiglycol and 101 parts of acrylic acid were added, and the resultant mixture was heated at 80° C. for 3 hours to give a resin solution (A-5) having a solid content of 74.5%. The resin (as solids) had a polymerizable unsaturated group content of 3.3 moles/kg, a tertiary sulfonium-containing group content of 1.20 moles/kg and a peak molecular weight of about 1,200 as measured by GPC.

COMPARATIVE PREPARATION EXAMPLE 1

The procedure of Preparation Example 2 was followed except that 10 parts of acrylic acid and 134 parts of acetic acid were used in lieu of 171 parts of acrylic acid. Thus was obtained a resin solution (C-1) having a solid content of 68.5%. The resin (as solids) had a polymerizable unsaturated group content of 0.18 mole/kg, a tertiary sulfonium-containing group content of 1.30 moles/kg and a peak molecular weight of about 1,400 as measured by GPC.

COMPARATIVE PREPARATION EXAMPLE 2

| | |
|---|---|
| Epikote 1004 | 500 parts |
| Acrylic acid | 34 parts |
| Triethylamine | 4.4 parts |

The above materials were dissolved in 200 parts of methyl isobutyl ketone in a flask, and the solution was heated at 70° C. for 8 hours to give a resin solution (C-2) having a solid content of 73%. The resin (as solids) had a polymerizable unsaturated group content of 0.88 mole/kg, a quaternary ammonium-containing group content of 0.08 mole/kg and a peak molecular weight of about 1,000 as measured by GPC.

COMPARATIVE PREPARATION EXAMPLE 3

| | |
|---|---|
| Epikote 154 | 500 parts |
| Acrylic acid | 108 parts |
| 70% Formic acid | 92.4 parts |
| 30% Trimethylamine | 572 parts |
| Hydroquinone | 0.5 part |

The above materials were dissolved in 300 parts of ethylene glycol monobutyl ether in a flask, and the solution was heated at 40° C. for 15 hours to give a resin solution (C-3) having a solid content of 54%. The resin (as solids) had a polymerizable unsaturated group content of 1.8 moles/kg, a quaternary ammonium-containing group content of 3.44 moles/kg and a peak molecular weight of about 850 as measured by GPC.

COMPARATIVE PREPARATION EXAMPLE 4

| | |
|---|---|
| Styrene | 35 parts |
| Methyl methacrylate | 25 parts |
| Acrylic acid | 40 parts |
| tert-Butyl peroctoate | 3 parts |

The above mixture was added dropwise to 145 parts of 2-ethoxyethyl acetate heated at 110° C. over 2 hours and, thereafter, the temperature of 110° C. was maintained for 8 hours. The acrylic resin obtained had an acid value of 312, a glass transition temperature (hereinafter referred to as "Tg") of 104° C. and a peak molecular weight of about 16,000 as measured by GPC.

Then, 45 parts of glycidyl methacrylate, 0.1 part of tetraetylammonium bromide and 0.05 part of hydroquinone were added to the above resin solution, and the resultant mixture was heated at 110° C. for 4 hours to give a resin solution (C-4) having a solid content of 50%. The resin (as solids) had an acid value of 92 and a polymerizable unsaturated group content of 2.2 moles/kg.

Photopolymerizable compositions respectively having the compositions shown below in Table 2 were prepared by adding various additives to the resin solutions prepared in the above-mentioned Preparation Examples and Comparative Preparation Examples and kneading the resultant mixtures on a test roll.

The compositions thus obtained were applied to copper through-hole printed circuit board substrates to a dry film thickness of 15–20 μm by the silk screen method. After 10 minutes of preliminary drying at 70° C., the films were exposed to 400 mJ/cm² or 800 mJ/cm² of light either through a polyethylene terephthalate film (for developability evaluation) or directly without using said film (for testing in other respects). The resist films thus obtained were subjected to several performance tests. The results obtained are shown below in Table 3.

Notes to Table 2:
*4 Modaflow is a surface active agent manufactured by Monsanto Co., Ltd., USA.
*5 Fluorad FC No. 430 is a fluorine-containing surface active agent manufactured by 3M Co., USA.
*6 Flowlen AC-300 is a surface active agent manufactured by Kyoeisha Chemical Co., Ltd., Japan.

[Test methods]

Developability: Tap water was used as the developer.

(In Comparative Example 8 alone, 1.5% aqueous solution of sodium carbonate was used as the developer.) The resist films after exposure to light were sprayed with the developer at 25° C. at a nozzle pressure of 2 kg/cm² for 90 seconds or 180 seconds.

A: Completely developable even within the through holes.
B: Completely developable on the substrate surface alone.
C: Undevelopable portions even on the substrate surface, or defective lines due to erosion, swelling and/or the like caused by the developer.
D: Almost undevelopable.

For initial adhesion, acid resistance, solder plating resistance and boiling water resistance testing, the resist films after exposure to light (400 mJ/cm²) were further heated at 140° C. for 30 minutes and then subjected to the respective tests.

Initial adhesion:

According to JIS D 0202, the film layer of each test piece was provided with cuts crossing at right angles at 1-mm intervals to give 100 squares. A cellophane adhesive tape was applied to the cut surface and then peeled off therefrom. The initial adhesion was evaluated in terms of the ratio between the number of squares remaining unpeeled (numerator) and the original number of intact squares (denominator; 100).

Acid resistance:

On the resist film layer of each test piece was placed 3 ml of 1N aqueous sulfuric acid spottily. After an hour of standing in a drier maintained at 60° C., the resist film was evaluated for acid resistance by the eye.

According to JIS C 6481, the test pieces were allowed to float on a solder bath at 260° C. for 10 seconds (one cycle). After 3 or 8 floating cycles, the test piece was evaluated by the eye and subjected to the same adhesion test as that for initial adhesion evaluation.

Boiling water resistance:

The test pieces were immersed in boiling water at 100° C. for 2 hours and then subjected to the same test as that for initial adhesion evaluation.

Storage stability:

The photopolymerizable compositions of Examples 4–8 and Comparative Examples 5–8 (each 100 cc) were placed in glass bottles and, after close stoppering, allowed to stand in a dark place maintained at 30° C. The storage stability was evaluated in terms of the time required for marked viscosity increase or gelation to take place.

TABLE 2

| Material (quantity in parts) | Example | Example 4 | 5 | 6 | 7 | 8 | Comparative Example 5 | 6 | 7 | 8 |
|---|---|---|---|---|---|---|---|---|---|---|
| Unsaturated resin solution | Kind | A-1 | A-2 | A-3 | A-4 | A-5 | C-1 | C-2 | C-3 | C-4 |
|  | Parts | 135 | 145 | 140 | 125 | 135 | 145 | 140 | 185 | 160 |
| Resin added | Kind |  |  |  |  |  |  |  |  | Epikote 154 |
|  | Parts |  |  |  |  |  |  |  |  | 20 |
| Photo-initiator | α-Hydroxy-isobutyrophenone | 3 |  | 5 |  |  | 5 |  |  |  |
|  | Benzoin ethyl ether |  | 5 |  |  |  |  | 5 | 5 | 5 |
|  | Benzophenone |  |  |  | 2 | 2 |  |  |  |  |
| Pigment | Phthalocyanine Green | 0.5 | 0.5 | 0.5 | 0.5 | 0.5 | 0.5 | 0.5 | 0.5 | 0.5 |
|  | Barium sulfate |  |  |  | 20 |  |  |  | 50 |  |
|  | Finely divided talc |  | 50 |  |  |  |  | 20 |  |  |
|  | Hydrophobic silica |  |  |  | 5 |  |  |  |  |  |
| Catalyst | Lead octanoate |  | 1.0 |  |  |  |  |  |  |  |
|  | Dicyandiamide |  |  |  |  |  |  |  |  | 1.0 |
| Additive | Modaflow (*4) | 1.5 | 2.0 |  |  |  | 1.5 |  |  | 2.0 |
|  | FC No. 430 (*5) |  |  | 0.2 |  |  |  | 0.2 | 0.2 |  |
|  | AC-300 (*6) |  |  |  | 0.5 | 0.5 |  |  |  |  |
| Polymerizable unsaturated group content (moles/kg) |  | 3.4 | 3.0 | 0.63 | 2.5 | 3.3 | 0.18 | 0.88 | 1.8 | 1.4 |
| Onium salt group content (moles/kg) |  | 0.55 | 1.26 | 0.31 | 1.55 | 1.20 | 1.30 | 0.08 | 3.44 | — |

TABLE 3

| Test item | Example | Example 4 | 5 | 6 | 7 | 8 | Comparative Example 5 | 6 | 7 | 8 |
|---|---|---|---|---|---|---|---|---|---|---|
| Develop-ability | 400 mJ/cm² 90 sec. | A | A | A | A | A | D | C | D | A |
|  | 400 mJ/cm² 180 sec. | A | A | A | A | A | D | C | D | A |
|  | 800 mJ/cm² 90 sec. | A | A | A | A | A | D | D | C | A |
|  | 800 mJ/cm² 180 sec. | A | A | A | A | A | D | D | D | A |
| Initial adhesion |  | 100/100 | 100/100 | 100/100 | 100/100 | 100/100 | 80/100 | 100/100 | 90/100 | 100/100 |
| Acid resistance |  | A | A | A | A | A | D | A | D | D |
| Solder plating resistance | After 3 cycles | NA | NA | NA | NA | NA | Blistering | NA | NA | NA |
|  | After 8 cycles | NA | NA | NA | NA | NA | Blistering | NA | Blistering | Blistering |
|  | Adhesion after 8 cycles | 100/100 | 100/100 | 100/100 | 100/100 | 100/100 | 30/100 | 100/100 | 10/100 | 50/100 |
| Adhesion after immersion in boiling water |  | 100/100 | 100/100 | 100/100 | 100/100 | 100/100 | 0/100 | 100/100 | 50/100 | 30/100 |
| Storage stability |  | >6 mos. | >6 mos. | >6 mos. | >6 mos. | >6 mos. | >6 mos. | >6 mos. | >6 mos. | 24 hrs. |

Note
*NA: No abnormality.*

A: No change at all in the state of coating film.
B: Slight swelling and/or discoloration of the film.
C: Distinct discoloration of the film.
D: Dissolution and/or peeling off of the film.

Solder plating resistance:

What is claimed is:

1. A method of forming a cured coating film comprising the steps of:

A) forming an uncured coating film on a substrate by applying a coating composition comprising as a main component an aromatic epoxy resin derivative containing, per kilogram of said derivative, 0.3 to 10 moles of a polymerizable unsaturated group which is at least one member selected from the group consisting of acryloyl, methacryloyl, itaconoyl, maleoyl, fumaroyl, crotonoyl, acrylamido, methacrylamido, cinnamoyl, vinyl and allyl, and 0.1 to 3 moles of an aprotic onium-containing group of the formula

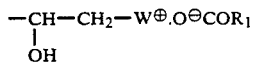  (I)

wherein $R_1$ is hydrogen or a hydrocarbon having 1-8 carbon atoms, which may be substituted with a hydroxyl, alkoxy or ester group or a halogen atom;

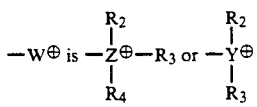

wherein Z is nitrogen or phosphorus and Y is sulfur; $R_2$, $R_3$ and $R_4$ are the same or different and are an organic group of 1-14 carbon atoms, wherein $R_2$ and $R_3$, or $R_2$, $R_3$ and $R_4$ may jointly form a heterocyclic group when taken together with the adjacent nitrogen, phosphorus or sulfur, said aromatic epoxy resin derivative being prepared from an aromatic epoxy resin having a molecular weight of 500 to 5,000 as determined by gel permeation chromatography;

wherein said coating composition further comprises a photopolymerization initiator;

B) drying to the touch at a temperature between 70° to 100° C. the uncured coating film on the substrate;

C) curing the exposed portions of said dried film by irradiating said film with actinic radiation through a photomask;

D) developing the irradiated film with water or a dilute aqueous acid solution for dissolution and removal of the unexposed areas of the film; and E) subjecting the developed film to a heat treatment.

2. A method as claimed in claim 1, wherein said aromatic epoxy resin is at least one member selected from the group consisting of: (a) diglycidyl ethers derived from aromatic bisphenols; (b) polymers of diglycidyl ethers and aromatic bisphenols; (c) phenol novolak epoxy resins; (d) cresol novolak epoxy resins; (e) triglycidyl isocyanurate; (f) nuclearly halogenated derivatives of any one of the resins (a–e); and (g) partial modifications of any one of the resins (a–e).

3. A method as claimed in claim 1, wherein said aromatic epoxy resin derivative has at least one polymerizable unsaturated group per molecule.

4. A method as claimed in claim 1, wherein the coating composition is used in the form of an aqueous solution or aqueous dispersion.

5. A method as claimed in claim 1, wherein the heat treatment is carried out at about 120° C. to 180° C. for about 10 to 60 minutes.

* * * * *